United States Patent [19]
Ito et al.

[11] Patent Number: 5,119,320
[45] Date of Patent: Jun. 2, 1992

[54] CROSS COIL TYPE INDICATOR

[75] Inventors: Tadao Ito; Shouzo Ashizawa; Shigeru Ohishi, all of Shizuoka, Japan

[73] Assignee: Yazaki Corporation, Japan

[21] Appl. No.: 389,880

[22] Filed: Aug. 4, 1989

[30] Foreign Application Priority Data

Nov. 9, 1988 [JP] Japan .......................... 63-145358[U]
Feb. 6, 1989 [JP] Japan ................................ 1-12185[U]

[51] Int. Cl.$^5$ ............................................. G01R 1/38
[52] U.S. Cl. ............................ 364/571.01; 324/154 R
[58] Field of Search ................. 324/154 R; 364/571.01

[56] References Cited

U.S. PATENT DOCUMENTS

| | | | |
|---|---|---|---|
| 3,946,311 | 3/1976 | Baker et al. | 324/167 |
| 4,051,434 | 9/1977 | Sweet | 324/166 X |
| 4,230,984 | 10/1980 | Taylor | 324/115 |
| 4,356,445 | 10/1982 | Congdon | 324/82 |
| 4,553,093 | 11/1985 | Chikasue | 324/154 R X |
| 4,890,057 | 12/1989 | Kobayashi et al. | 324/166 X |
| 4,924,178 | 5/1990 | Miyajima | 324/154 R |

FOREIGN PATENT DOCUMENTS

| | | |
|---|---|---|
| 0255772 | 2/1988 | European Pat. Off. . |
| 3003151 | 10/1980 | Fed. Rep. of Germany . |
| 58-24214 | 5/1983 | Japan . |
| 63-145969 | 6/1988 | Japan . |
| 63-23960 | 8/1989 | Japan . |

*Primary Examiner*—Parshotam S. Lall
*Assistant Examiner*—Edward R. Cosimano
*Attorney, Agent, or Firm*—Wigman & Cohen

[57] ABSTRACT

In a cross coil type indicator having a pair of cross coils arranged in quadrature, a magnet rotor having a shaft and a pointer attached to the shaft and rotatably positioned within the coils, the pointer is positioned to indicated a variable by flowing pulse currents through the coils in which the duty ratio is related to the variable value. Digital data corresponding to the pointer angle is stored as sin $\Theta$ or cos $\Theta$ data in a read only memory to enable simple calculation of pointer position from the duty ratio of the current pulse. A stop pin is provided to limit rotation of the pointer at the end of the scale; a circuit is provided for determining when the pointer is adjacent to the pin or will be driven against the stop pin, and the drive currents are modified in response to such conditions to reduce repetitive striking of the pin by the pointer and to minimize the force with which the pointer is driven against the pin at the stop pin end of the scale.

6 Claims, 10 Drawing Sheets

CROSS COIL TYPE INDICATOR

BACKGROUND OF THE INVENTION

1. Field of the Invention

The present invention relates to a cross coil type indicator in which a magnet rotor is rotated by a resultant magnetic field generated by cross coils arranged in quadrature with each other and a detected variable is indicated by a pointer rotated together with the rotor.

2. Description of the Prior Art

As shown in FIG. 1, the pointer driving portion of the cross coil type indicator is, in general, comprised of a pair of coils $L_1$ and $L_2$ arranged in quadrature with each other, a magnet rotor Mg rotatively provided in a resultant magnetic field generated by the two coils $L_1$ and $L_2$, a pointer A provided at one end of the rotary shaft (not shown) mounted on the magnet rotor Mg, a scale plate B for indicating the detected variable in cooperation with the rotating position of the pointer A, a zero point stopper pin P which restricts the rotation of the pointer A, and a spiral spring C for biasing the pointer A and the magnet rotor Mg toward the stopper pin P.

With this construction, when drive currents $i_1$ and $i_2$ are flowed through the cross coils $L_1$ and $L_2$ in quadrature as shown in FIG. 2, respectively, magnetic fields generated in each of the coils can be represented by the following equations;

$$\left.\begin{array}{l} \phi_1 = \mu_1 i_1 n_1 S_1 \\ \phi_2 = \mu_2 i_2 n_2 S_2 \end{array}\right\} \quad (1)$$

Here, $\mu_1$ and $\mu_2$ indicate each magnetic permeability of the coils $L_1$ and $L_2$, respectively, $n_1$ and $n_2$ indicate the number of windings of the coils, respectively, and $S_1$ and $S_2$ indicate each cross-sectional area of the coils, respectively.

On the other hand, since the magnet rotor Mg is rotated in the resultant magnetic direction of the magnetic fields $\phi_1$ and $\phi_2$, its rotation angle $\alpha$ can be represented by the following equation;

$$\alpha = \tan^{-1} \frac{\phi_2}{\phi_1} = \tan^{-1} \frac{\mu_2 i_2 n_2 S_2}{\mu_1 i_1 n_1 S_1} \quad (2)$$

When the coils $L_1$ and $L_2$ having an equal structure respectively is used, the equation (2) can be rewritten as follows;

$$\alpha = \tan^{-1} \frac{i_2}{i_1} \quad (3)$$

That is to say, the rotation angle $\alpha$ is defined by the drive currents $i_1$ and $i_2$.

Supposing that the drive currents $i_1$ and $i_2$ are $$\left.\begin{array}{l} i_1 = I_0 \cos\theta \\ i_2 = I_0 \sin\theta \end{array}\right\} \quad (4)$$

then, the rotation angle $\theta$ corresponding to the resultant magnetic field can be represented as follows;

$$\begin{aligned} \alpha &= \tan^{-1} \frac{i_2}{i_1} = \tan^{-1} \frac{I_0 \sin\theta}{I_0 \cos\theta} \\ &= \tan^{-1}(\tan\theta) = \theta \end{aligned} \quad (5)$$

Namely, the rotation angle $\theta$ becomes equal to the rotation angle of the pointer, i.e., $\alpha = \theta$. As a result, the direction of the resultant magnetic field generated by the cross coils $L_1$ and $L_2$ becomes equal to the angle $\theta$ as shown in FIG. 3 and the magnet rotor Mg is rotated up to the rotation angle $\theta$ against the biasing force of the spiral spring C, which corresponds to the detected variable.

Accordingly, by reading the position of the pointer A which rotates together with the magnet rotor Mg with respect to the scale plate B, it becomes possible to know the value of the detected variable. It is to be noted that the amplitudes of the drive currents $i_1$ and $i_2$ in this case are determined by taking into consideration of the biasing force of the spiral spring C.

In order to drive the cross coils as set forth above, it is necessary to provide a drive unit for driving the cross coils. In this case, it is preferable for the drive unit to be able to apply pulse currents of $\sin\theta$ and $\cos\theta$ having duty ratios corresponding to the detected variable to the cross coils as the drive currents. Further, in order to lower production cost of the indicator, it is requested for the drive unit to have a simple structure. Furthermore, if there is provided such a drive unit in an cross coil type indicator, several problems coused in a conventional cross coil type indicator can be settled since it becomes possible to make degital processing of various data.

Hereinafter, one of the problems will be described with reference to the drawings.

FIGS. 4 to 6 show one of prior art indicators having a drive unit which can apply pules currents having duty ratios corresponding to the detected variable.

Namely, in the drive unit of the cross coil type indicator as shown in FIG. 4, pulse currents having duty ratios corresponding to the detected variable are generated, and they are applied to the cross coils $L_1$ and $L_2$ through an output circuit 50.

The drive unit comprises a sensor 10 for detecting a variable such as car speed, a frequency/voltage (F/V) converter 20, a duty ratio calculating circuit 30, a duty pulse generating circuit 40 and an output circuit 50. The cross coils $L_1$ and $L_2$ and the magnet rotor Mg are the same as those indicated in FIG. 1.

In operation, an output signal such as vehicle speed from the sensor 10 is applied to the frequency/voltage (F/V) converter 20, where the frequency of the output signal is converted into a D.C. voltage. The D.C. voltage thus converted is applied to a duty ratio calculating circuit 30, where $\sin\theta$ and $\cos\theta$ of the rotation angle $\theta$ of the pointer A are sought in accordance with the voltage. Then, each duty ratio shown in FIG. 5 is calculated therein from duty characteristics which change in accordance with $\sin\theta$ and $\cos\theta$. Each of the duty pulses is generated in the duty pulse generating circuit 40 and pulse currents having duty ratios are applied to the coils $L_1$ and $L_2$ through the output circuit 50, respectively.

Since the pulse currents $i_1$ and $i_2$ are proportional to $\sin\theta$ and $\cos\theta$ and the angle $\alpha$ of the resultant magnetic field is changed in accordance with the detected variable, the pointer A is rotated against the biasing force of the spiral spring in the direction of the resultant magnetic field vector, thus enabling the read-out of the rotation angle of the pointer A from the scale plate B.

Now, as stated previously a stopper pin P is provided at a position near the zero indicating position as shown in FIG. 1 and the pointer A is normally biased by the spiral spring C toward the stopper pin P. As a result, when the pointer A is situated near the zero indicating position in the case of a speed meter or "E" position in the case of a fuel indicator, the pointer A comes into contact with the stopper pin P. Since a desirable linearity in indication cannot be maintained in the vicinity of "zero" or "E" position on the scale plate B, the "zero" or "E" position has to be shifted to a higher position which is normally about 5° to 10° above from its actual position, and the stopper pin position must also be shifted to the corresponding position. Because of this situation, noise is generated by repeated abutments between the pointer and stopper pin due to the reasons which will be explained later.

FIG. 6 indicates a detailed circuit construction of the output circuit 50 shown in FIG. 4. In the output circuit 50, two pairs of the NPN transistors Q11, Q13 and Q12, Q14 are connected in the form of a first bridge circuit together having the first coil $L_1$, and another two pairs of the NPN transistors Q21, Q23 and Q22, Q24 are connected in the form of a second bridge circuit having the second coil $L_2$ between the power supply +Vcc and the ground. Each base of the transistors Q11 through Q24 is connected to the duty pulse generating circuit 40.

In operation, when each of the pulse currents $i_1$ and $i_2$ is desired to flow through the coils $L_1$ and $L_2$ in the direction of the solid line shown in FIG. 6, the transistors Q11, Q14 are turned on and the transistors Q21, Q24 are turned off, while the transistors Q21, Q24 are turned on and the transistors Q22, Q23 are turned off by the application of pulse signals to the base of each transistor from the duty pulse generating circuit 40.

On the other hand, when the pulse currents $i_1$ and $i_2$ as the drive currents are desired to flow through the coils $L_1$ and $L_2$ in the direction of the dotted line shown in FIG. 6, the transistors Q12, Q13 are turned on and the transistors Q11, Q14 are turned off while the transistors Q22, Q23 are turned on and the transistors Q21, Q24 are turned off.

Since the pointer A is driven by the pulse currents flowing through the coils $L_1$ and $L_2$, which are responsive to the changes in the duty ratios or the detected variable, the pointer A is subject to a vibration generated by the changes and therefore noise is generated when the pointer A strikes the stopper pin P. Especially, when the indicator is applied to a speed meter, under the low speed condition the pointer A is constructed in such a manner that it never comes off from the stopper pin so that on and off action is repeatedly happened between the pointer A and the stopper pin P at a low speed condition due to the vibration in the changes of the detected variable, and noise is generated thereby.

SUMMARY OF THE INVENTION

It is therefore a first object of the present invention to provide a cross-coil type indicator having a drive unit for driving cross coils, which has a simple structure so as to produce it with low cost.

It is a second object of the present invention to provide a cross-coil type indicator in which the duty ratios of pulse currents are calculated by digital data corresponding to rotational angles $\theta$ of the pointer of the indicator, and its sin $\theta$ and cos $\theta$, which have been preliminarily stored in a ROM and read from the ROM, and pulse currents having each duty ratios responsive to a detected variable are generated in a duty pulse generating circuit and they are applied to cross coils in quadrature, thereby simplifying the duty ratio calculation.

It is a third object of the present invention to provide a cross coil type indicator having a stopper pin for restricting the rotational movement of a pointer of the indicator in which detection means for detecting whether or not actual rotational angles of the pointer of the indicator fall within a predetermined range of angles and for producing an output signal in accordance with the result of the detection, and compensation means for compensating the duty ratios of the pulse currents to be applied to the cross coils are provided, whereby only when the actual rotational angle of the pointer falls within the predetermined range of angle, the compensation means compensates for the duty ratios of the pulse currents, so as to reduce the torque of the pointer and to suppress the generation of noise caused by repeated abutments between the pointer and the stopper pin.

In order to achieve the first and second objects, a cross coil type indicator having a drive unit includes a pair of cross coils arranged in quadrature, and a magnet rotor having a pointer at its center and rotatively provided within the coils by a resultant magnetic field generated by the coils and capable of indicating a detected variable by flowing pulse currents in the coils in accordance with the detected variable, wherein the indicator further comprises: data generating means for generating sin $\theta$ and cos $\theta$ data in accordance with the actual rotational angle of the pointer responsive to the detected variable, a ROM forming the data generating means; pulse generating means for generating pulse currents having duty ratios corresponding to the sin $\theta$ and cos $\theta$ thus generated and to be applied to the cross coils; and output circuit means for driving the coils in accordance with the pulse currents thus generated.

According to the cross coil type indicator with a drive unit having the above structure, data processing is performed in the single ROM forming the data generating means, it becomes possible to simplify its structure, thus leading to a reduction in manufacturing cost. Further, according to this cross coil type indicator, since only sin $\theta$ data within the range of $0° \leq \theta \leq 90°$ is to be stored in the ROM, it becomes possible to have high resolutional indication characteristic by a ROM having a certain capacity in comparison with the cases in which the other data is stored therein.

Further, in order to achieve the third object, a cross coil type indicator of the present invention includes a pair of cross coils arranged in quadrature, a magnet rotor having a pointer at its center and rotatively provided within the coils by a resultant magnetic field generated by the cross coils and capable of indicating a detected variable by flowing pulse currents in the coils in accordance with the detected variable and a stopper pin for restricting the movement of the pointer at a low rotational angle, wherein the indicator further comprises: detection means for detecting whether or not actual rotational angles of the pointer of the indicator fall within a predetermined range of angle, where the pointer has a possibility of contacting with the stopper pin, and for providing an output signal in accordance with the result of the detection; and a current control circuit means having its input connected to the output of the detection and its output thereof connected to an output circuit means for driving the cross coils by pulse currents having duty ratios calculated by a duty ratio calculation circuit means, whereby only when the former angle of the pointer is within the predetermined latter angle, the amplitudes of the pulse currents from the output circuit means are reduced by an output signal from the current control circuit means.

According to the cross coil type indicator having the above structure, it becomes possible to suppress generation of noise caused by repeated abutments between the pointer and stpeer pin within the predetermined range of the angle of the pointer.

These objects, features, and advantages of the invention will be better understood from the following description with reference to the accompanying drawings.

DESCRIPTION OF THE PREFERRED EMBODIMENTS

Referring now to the accompanying drawings, preferred embodiments of the present invention will be described.

Figure 7:
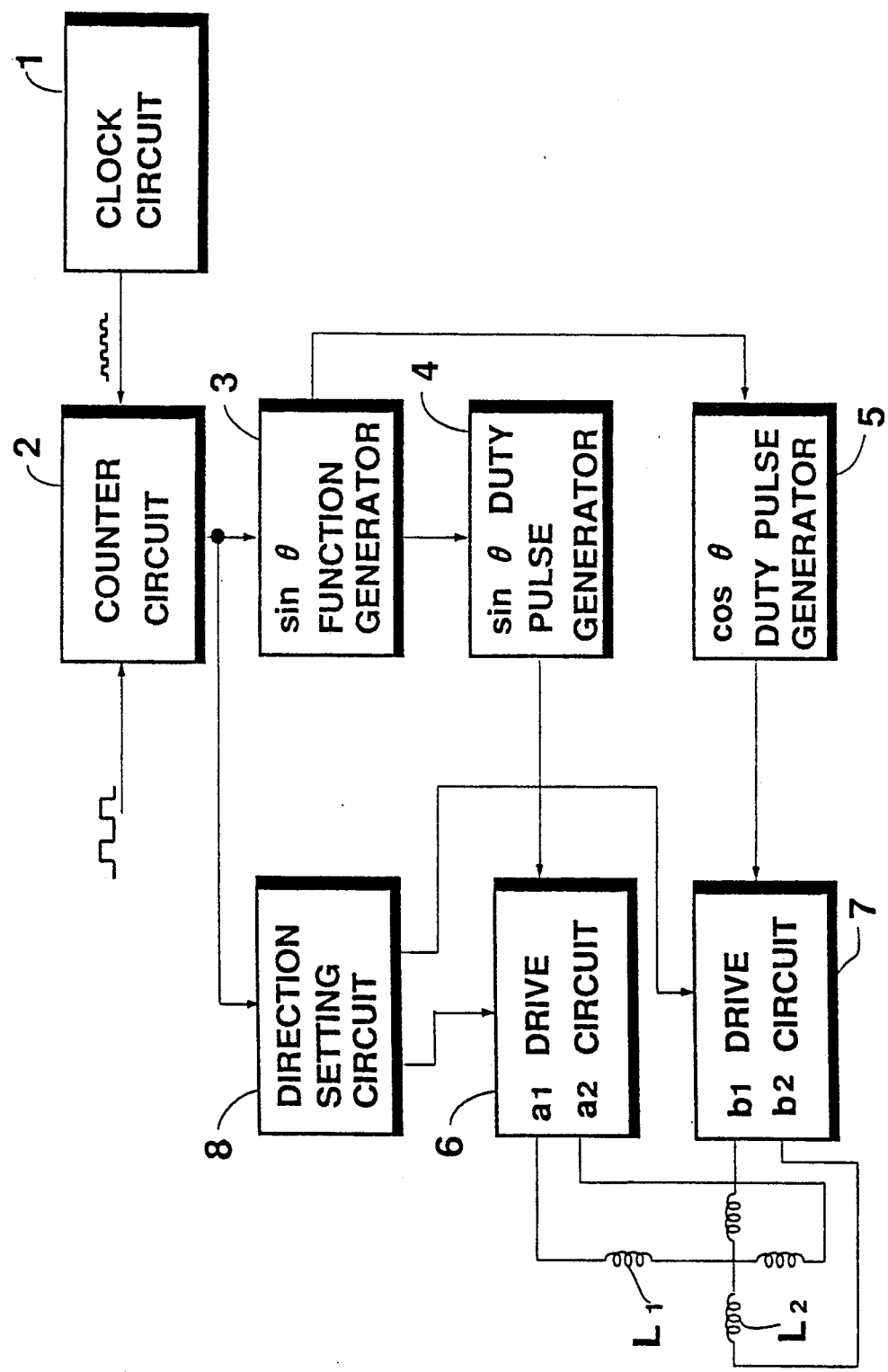
FIG. 7 shows one example of a drive unit for a cross coil type indicator according to the present invention.

FIG. 7 shows an embodiment of a drive units for driving cross coils $L_1$ and $L_2$ by pulse currents of sin $\theta$ and cos $\theta$ generated by a sin $\theta$ function generator of a ROM.

The drive unit comprises a clock circuit 1, a counter circuit 2, a sin $\theta$ function generator circuit 3, a sin $\theta$ duty pulse generator 4, a cos $\theta$ duty pulse generator 5, a first drive circuit 6, a second drive circuit 7, and a direction setting circuit 8. The cross coils $L_1$ and $L_2$ arranged in quadrature with each other are constructed in the same manner as those indicated in FIG. 1.

In operation, a rectangular signal, the time period of which varies in accordance with the detected variable such as vehicle speed and clock signals are applied to the counter circuit 2. The output signal from the counter circuit 2 is applied to the sin $\theta$ function generator circuit 3 and the sin $\theta$ function signal from the function generator circuit 3 of a ROM is applied to sin $\theta$ duty pulse generator circuit 4 directly, so as to generate a sin $\theta$ duty pulse therefrom.

On the other hand, the sin $\theta$ function signal is indirectly applied to the cos $\theta$ duty pulse generator 5. Namely, the sin $\theta$ function signal from the function generator circuit 3 is applied to the drive circuit 7 after shifting the phase of the sin $\theta$ output signal by 90° by phase shift means (not shown) according to the principle of sin $(90° \pm \theta) = \cos \theta$.

The pulse currents thus generated by the sin $\theta$ duty pulse generator 4 and cos $\theta$ duty pulse generator 5 are applied to the coils $L_1$ and $L_2$ through the drive circuits 6 and 7, respectively.

The direction setting circuit 8 determines the direction of the drive currents flowing through the cross coils $L_1$ and $L_2$ in accordance with the output signal from the counter 2 circuit. The following table 1 indicates the relationship among the quadrant, angles, and the connection of the output terminals in the drive circuits 6, 7.

TABLE 1

| DIGITAL DATA | QUADR-ANT | ANGLE | OUTPUT TERMINALS | | | |
|---|---|---|---|---|---|---|
| | | | $a_1$ | $a_2$ | $b_1$ | $b_2$ |
| 0–90 | 1 | 0°–90° | $i_1$ | G | $i_2$ | G |
| 90–180 | 2 | 90°–180° | $i_1$ | G | G | $i_2$ |
| 180–270 | 3 | 180°–270° | G | $i_1$ | G | $i_2$ |
| 270–360 | 4 | 270°–360° | G | $i_1$ | $i_2$ | G |

(Note) G indicates the ground level.

As shown in the table 1, the output terminals $a_1$, $a_2$, $b_1$, and $b_2$ of the drive circuits 6 and 7 are selected in accordance with the digital data from the counter circuit 2. Since each of the currents $i_1$ and $i_2$ flowing through the coils correspond to sin $\theta$ and cos $\theta$, the direction of the resultant magnetic field vector varies according to the detected variable. Accordingly, the magnet rotor Mg is rotated in the direction of the resultant magnetic field.

The sin $\theta$ function generator circuit 3 can be formed by a ROM. Each of the digital data corresponding to angle $\theta$ of sin $\theta$ data has preliminarily been stored in the ROM as shown in the following table 2.

TABLE 2

| DIGITAL DATA | | | ANGLE Θ | sin Θ | (cos Θ) |
|---|---|---|---|---|---|
| 0 | 180 | 180 | 360 | 0 | 0 | 1 |
| . | . | . | . | . | . | . |
| . | . | . | . | . | . | . |
| 30 | 150 | 210 | 230 | 30 | 0.5 | 0.85 |
| . | . | . | . | . | . | . |
| . | . | . | . | . | . | . |
| 90 | 90 | 270 | 270 | 90 | 1 | 0 |

Here, the angle $\theta$ corresponding to the digital data "0" is set to 0°, and rate of change of the degital data (in this table "1") corresponds to angle 1°, of which sin $\theta$ data is in the ROM. Further, the sin $\theta$ data has been stored within the range of $0° \leq \theta \leq 90°$ in the table 2. The sin $\theta$ data within the ranges of $90° \leq \theta \leq 180°$, $180° \leq \theta \leq 270°$ and $270° \leq \theta \leq 360°$ are corresponding to the sin $\theta$ data within the range of $0° \leq \theta \leq 90°$, respectively.

However, it is also possible to store the sin $\theta$ data between $0° \leq \theta \leq 360°$, as shown in the following table 3.

TABLE 3

| DIGITAL DATA | ANGLE Θ' | sin Θ | (cos Θ) |
|---|---|---|---|
| 0 | 0 | 0 | 1 |
| . | . | . | . |
| . | . | . | . |
| 30 | 30 | 0.5 | 0.85 |
| . | . | . | . |
| . | . | . | . |
| 90 | 90 | 1 | 0 |
| . | . | . | . |
| 150 | 150 | 0.5 | −0.85 |
| . | . | . | . |
| 180 | 180 | 0 | −1 |
| . | . | . | . |
| 210 | 210 | −0.5 | −0.85 |
| . | . | . | . |
| 270 | 270 | −1 | 0 |
| . | . | . | . |
| 330 | 330 | −0.5 | 0.85 |
| . | . | . | . |
| 360 | 360 | 0 | 1 |

In the case of the table 3, since current flowing direction can be set by adopting output terminals $a_1$ to $b_2$ of the drive circuits 6, 7 based on the sin $\theta$ (cos $\theta$) data, the direction setting circuit 8 can be omitted. The cos $\theta$ data can be obtained from the sin $\theta$ data by shifting the phase of the sin $\theta$, but the cos $\theta$ data may also be stored in the ROM.

Each of the pulse currents having duty ratios responsive to the detected variable can be generated from the sin $\theta$ duty pulse generator 4, and the cos $\theta$ duty pulse generator 5 in accordance with the sin $\theta$ data and the cos $\theta$ data read from the ROM.

Figure 8:
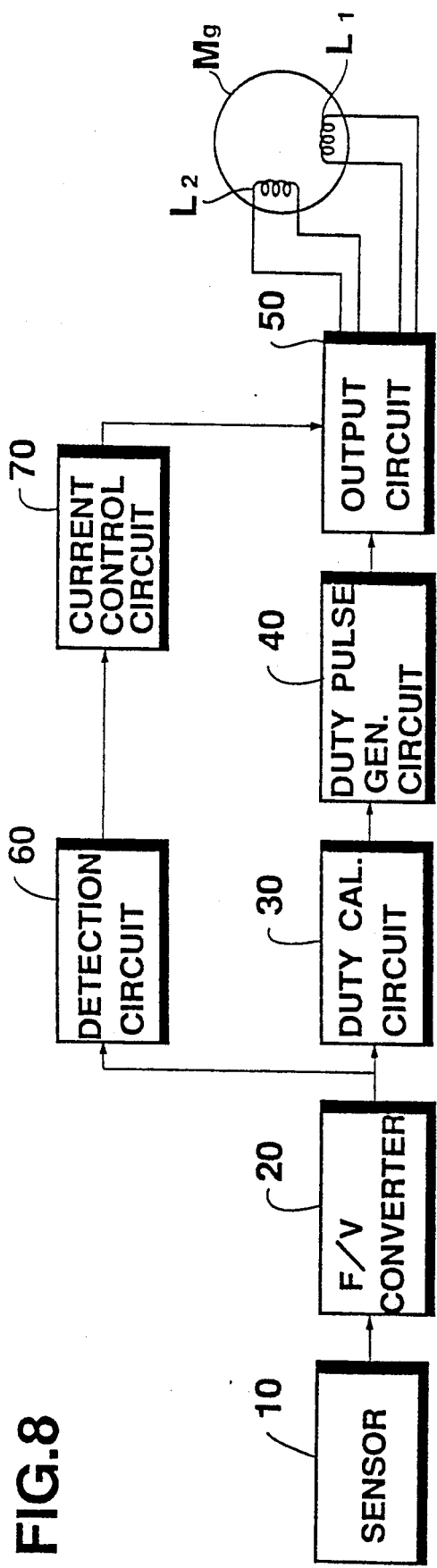
FIG. 8 shows the other embodiment of a drive unit for a cross coil type indicator according to the present invention.

FIG. 8 shows the other embodiment of the cross coils type indicator according to the present invention. The indicator comprises a detection circuit 60 for detecting the amplitude of D.C. voltage from a frequency/voltage converter (F/V converter) 20 and a current control circuit 70 responsive to an output signal from the detection circuit 60 for controlling the amplitude of the pulse currents produced from an output circuit 50.

Figure 4:
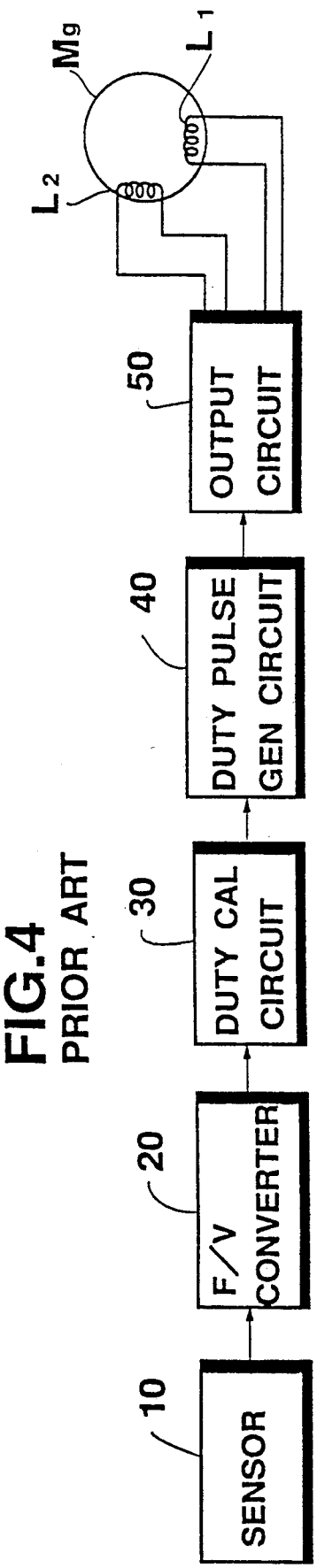
FIG. 4 shows a drive unit for the cross coils according to a prior art.
Figure 5:
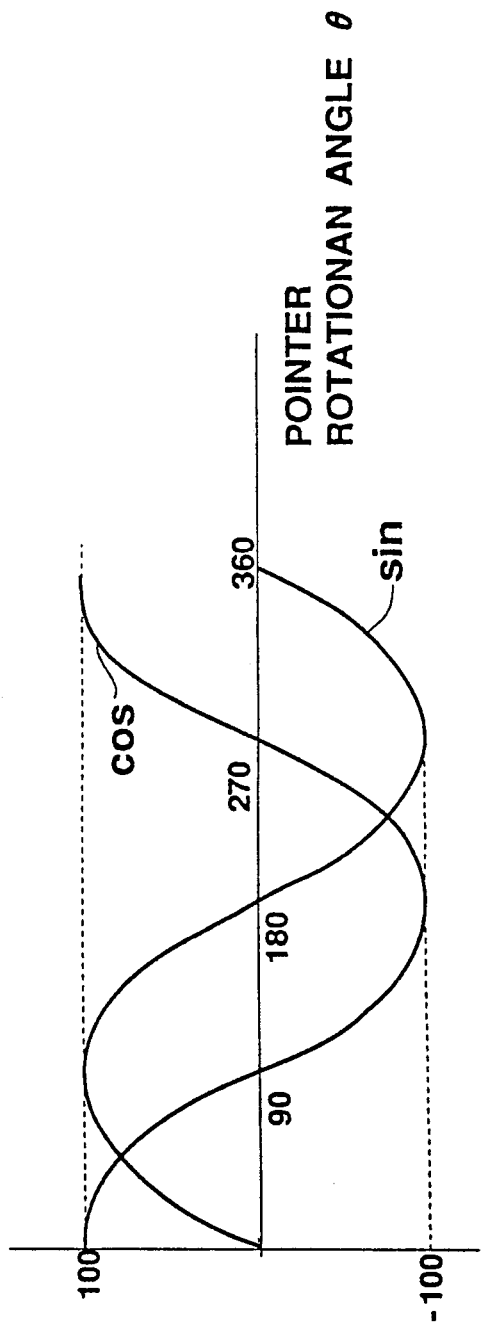
FIG. 5 shows the characteristics of duty ratios of sin $\theta$ and cos $\theta$ about the currents to be applied to the cross coils.

In FIG. 8, the same reference numerals indicate the same constructing elements as shown in FIG. 4. Namely, reference numeral 10 indicates a sensor for detecting a variable such as vehicle speed, engine speed and for producing a pulse signal, the frequency of which is responsive to the detected variable. Numeral 30 indicates a duty calculating circuit, 40 a duty pulse generating circuit, L1 and L2 cross coils, and Mg a magnet rotor.

In operation, a pulse signal is produced from the sensor 10 in accordance with the detected variable and it is applied to the F/V converter 20. The pulse signal is converted into a D.C. voltage by the F/V converter 20 and the output therefrom is applied to the detection circuit 60 on one hand, and to the duty calculating circuit 30 on the other hand. The detection circuit 60 detects the condition that whether or not actual rotational angles of the pointer responsive to the detected variable fall within a predetermined range of angles, e.g., between 0° and 10°, where the pointer A of the indicator has a possibility of contacting with the stopper pin P when the drive currents are initially applied to the cross coils $L_1$ and $L_2$, such as at a low range of angles of the pointer.

When the output signal from the F/V converter 20 do not fall within the predetermined range of angle, that is to say angle $\theta_1$, pulse currents having duty ratios calculated by the duty calculating circuit 30 are produced from the duty pulse generating circuit 40 and the output from the detection circuit 60 causes the current control circuit 70 to operate. As a result, the current produced from the output circuit 50 has to be applied to the coils L1 and L2 to decrease.

Figure 9:
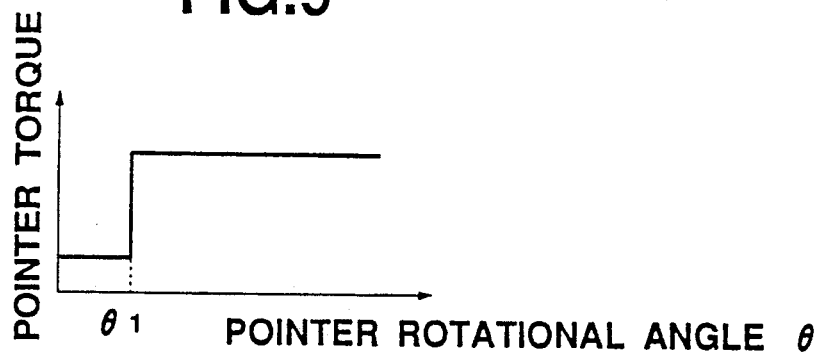
FIG. 9 shows the characteristics between pointer torque and rotational angle of the pointer.

FIG. 9 indicates the relationship between the pointer rotational angle $\theta$ and the pointer torque. As shown in FIG. 9, when the rotational angle $\theta$ of the pointer A falls within the range of the angle $\theta_1$ where the pointer A may contact with the stopper pin P, the amplitude of the pulse currents to be applied to the coils L1 and L2 are reduced. As a result, the torque of the pointer A is decreased so that the mechanical force of the pointer A which tends to contact the pointer A with the stopper pin P is also weakened, thus preventing the generation of noises. Since the low indication area near zero indication has generally a low accuracy, the decrease in the torque causes no problem.

Figure 10:
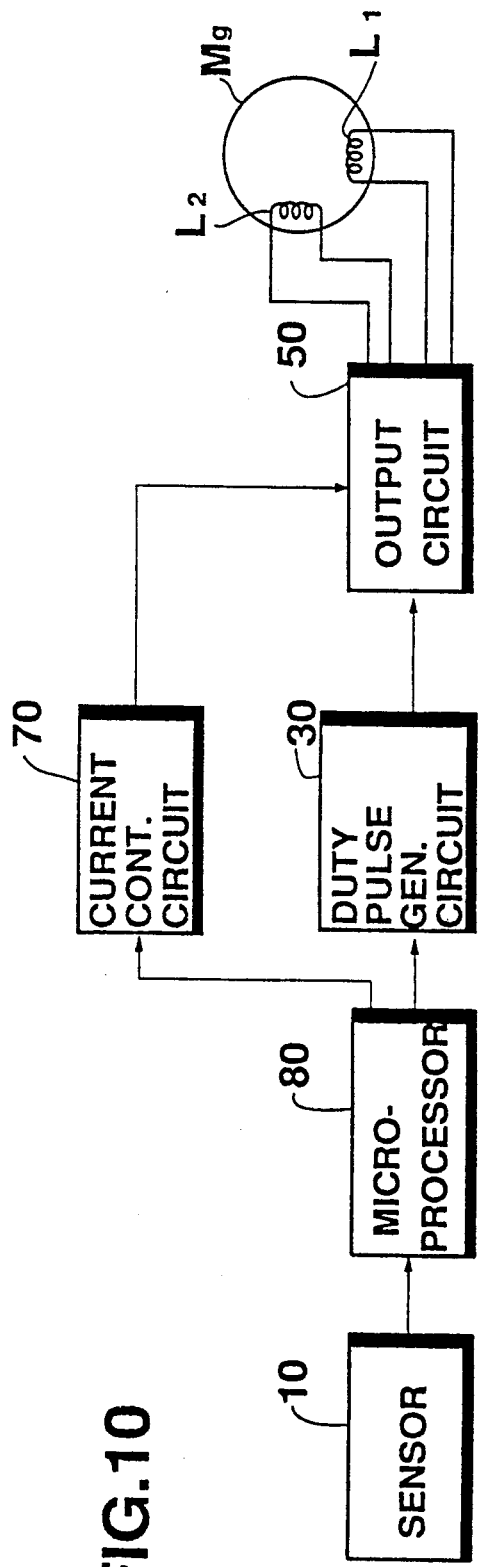
FIG. 10 shows another embodiment of a drive unit for a cross coil type indicator according to the present invention.

FIG. 10 shows another embodiment of the cross coil type indicator according to the present invention. In this embodiment, a microprocessor having a CPU (central processing unit), a RAM, and a ROM is used instead of the F/V converter 20, the duty calculation circuit 30 and the detection circuit 60 in FIG. 7. In this case, a pulse signal from the sensor 10 is directly applied to the microprocessor 80.

Figure 11:
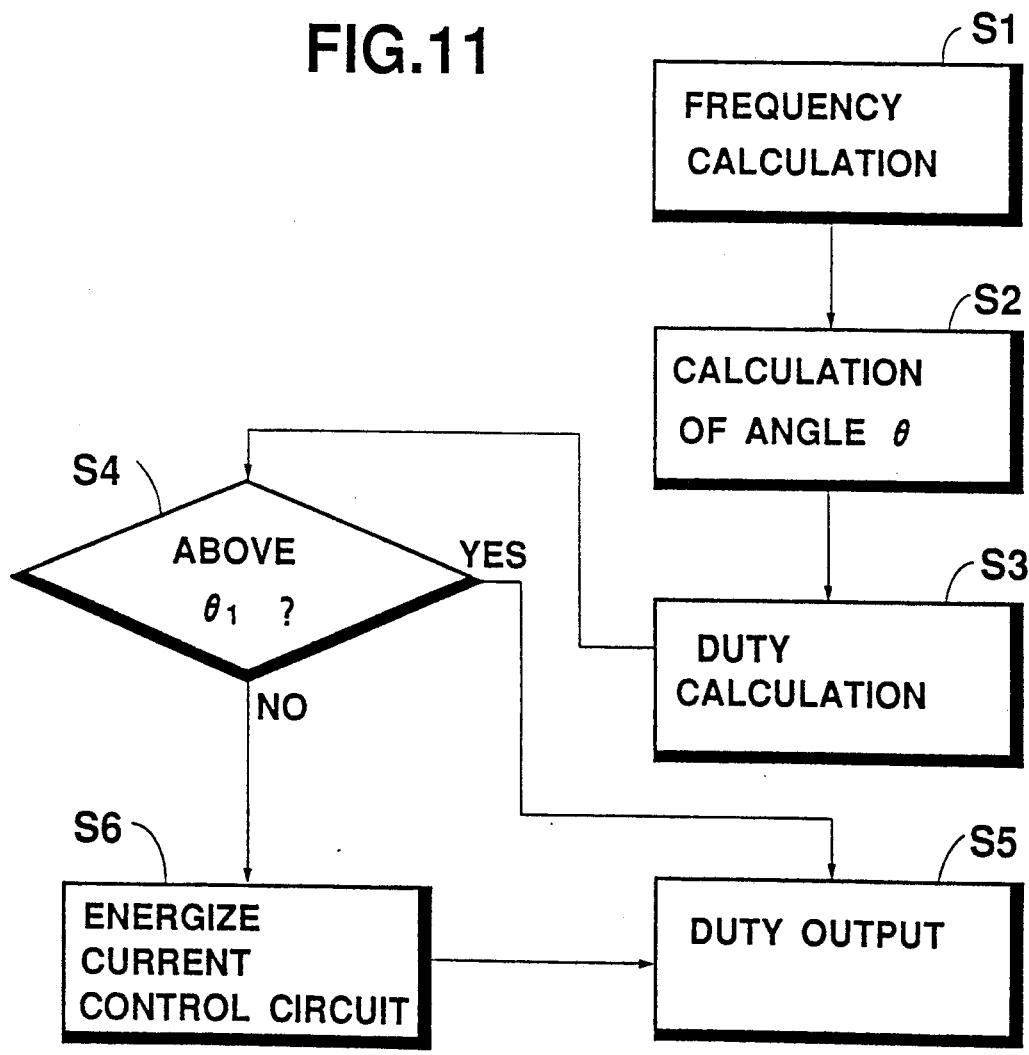
FIG. 11 is a control flow chart of the microprocessor shown in FIG. 9.

FIG. 11 shows a program flow chart of a control to be performed in the CPU of the microprocessor 80.

The operation of the CPU of the microprocessor 80 will now be made with reference to the flow chart of FIG. 11.

In step $S_1$, the frequency of the pulse signal from the sensor $\theta_1$ is calculated and the operation moves to step

9

$S_2$, where the rotational angle $\theta$ is calculated in accordance with the frequency. Then, the operation moves to step $S_3$, where the duty ratios of the pulse currents are calculated in accordance with $\sin \theta$ and $\cos \theta$ of the rotational angle $\theta$ and the operation now moves to step $S_4$.

In step $S_4$, a decision making is carried out about whether or not the duty ratios thus calculated are within a predetermined angle range $\theta_1$. If the result of the decision is YES, that is, when the duty ratios are above the angle range $\theta$, the operation moves to step $S_5$, where the duty pulses are generated from the duty pulse generating circuit 30 to the output circuit 50.

On the other hand, if the result of the decision in step $S_4$ is NO, that is, when the duty ratios are within the angle range $\theta_1$, the operation moves to step $S_6$, where the current control circuit 70 is energized by an output signal from the microprocessor 80 and the amplitude of each pulse current to be produced from the output circuit 50 is reduced. As a result, the rotational torque of the pointer A is also reduced. It is to be noted in this case that the biasing force of the spiral spring C of the pointer A (see FIG. 1) has to be taken into consideration, when calculating the duty ratios corresponding to the rotational angle of the pointer A.

Figure 6:
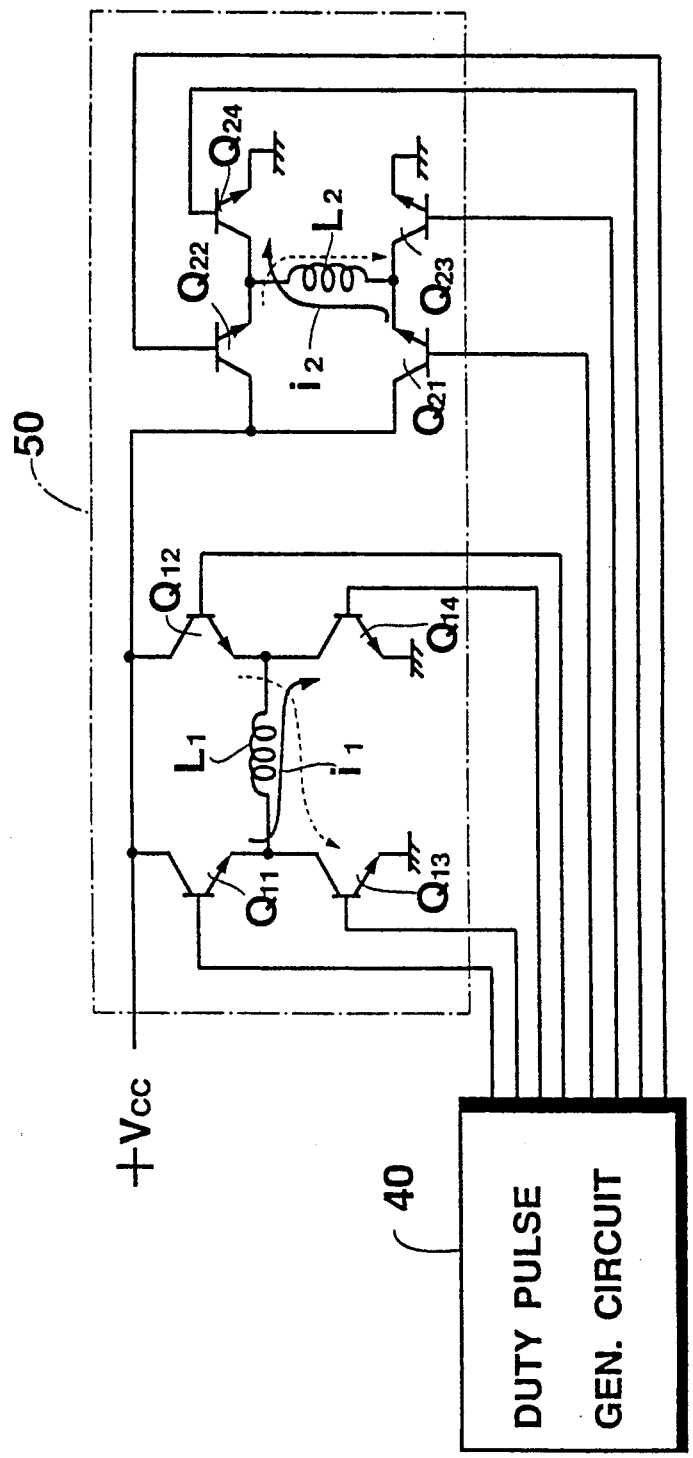
FIG. 6 shows a detailed description of the output circuit shown in FIG. 4.
Figure 12:
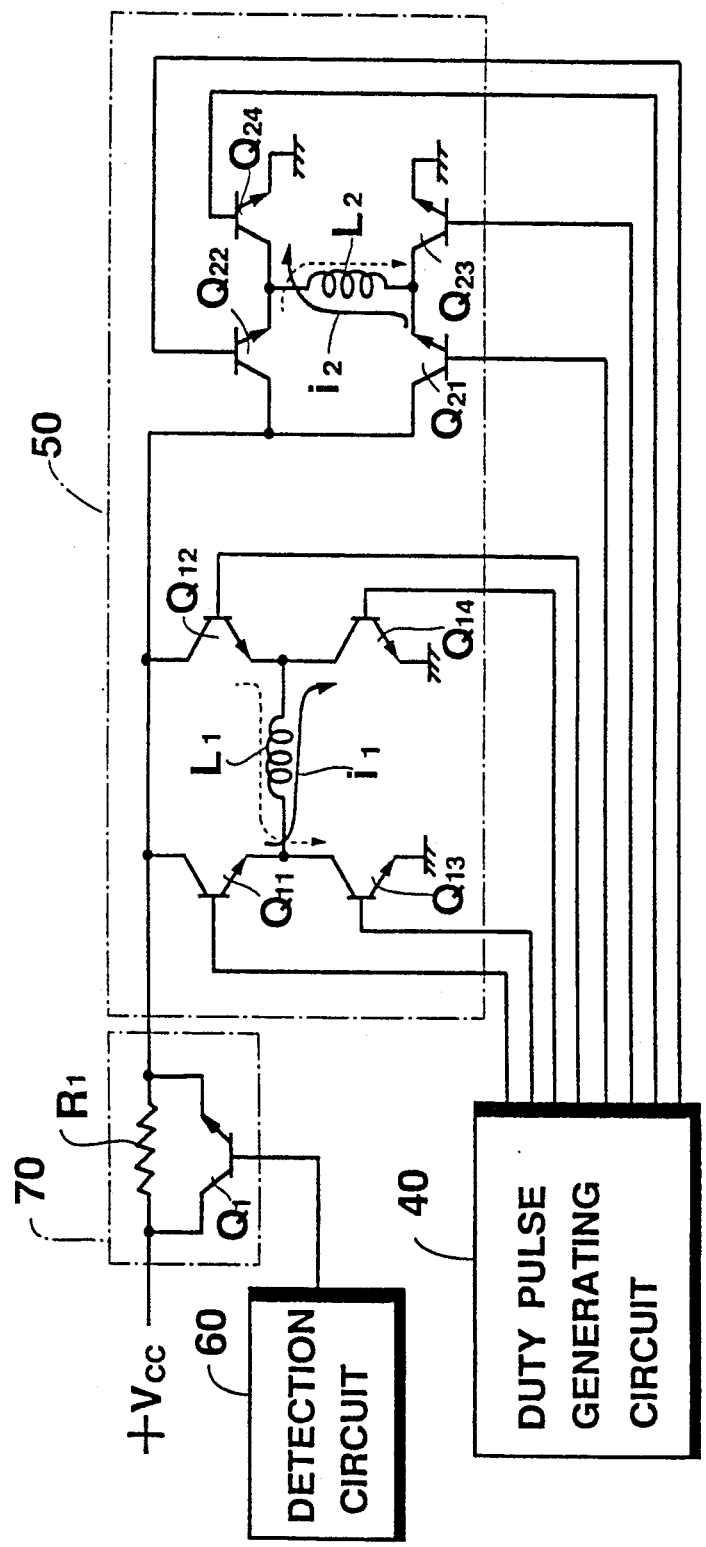
FIG. 12 shows one embodiment of the output circuit and a current control circuit according to the present invention.

FIG. 12 indicates a detailed circuit of the output circuit 50 and the current control circuit 70 shown in FIGS. 8 and 10, according to the present invention. The construction of the control circuit 50 is same as the one shown in FIG. 6. Therefore, a detailed explanation of the function of the output circuit 50 will not be necessary.

In FIG. 12, the current control circuit 70 comprises a transistor $Q_1$ and a resistor $R_1$ connected in parallel between the power supply $+Vcc$ and the input of the output circuit 50. The base of the transistor $Q_1$ is connected to the detection circuit 60 in FIG. 8 or to the microprocessor 80 in FIG. 10, and the collector and emitter of transistor $Q_1$ are connected through the resistor $R_1$.

In operation, when the rotational angle of the pointer A is above the predetermined angle $\theta_1$, the output signal from either the detection circuit 60 or the microprocessor 80 is applied to the base of the transistor $Q_1$. Then, the transistor $Q_1$ is rendered conductive and the power supply $+Vcc$ is directly connected to the output circuit 50. Accordingly, the circuit construction in this case becomes equivalent to the circuit construction shown in FIG. 6 and the pulse currents having the duty ratios corresponding to the rotational angle of the pointer A flow through the coils $L_1$ and $L_2$.

On the other hand, when the rotational angle of the pointer is within the predetermined angle $\theta_1$, the output signal from either the detection circuit 60 or the microprocessor 80 is not applied to the base of the transistor $Q_1$. As a result, the transistor $Q_1$ is not rendered conductive, so that the resistor $R_1$ is inserted between the power supply $+Vcc$ and the input of the output circuit 50. Consequently, the amplitude of the pulse currents $i_1$ and $i_2$ to be applied to the coils $L_1$ and $L_2$ are decreased, compared with the former case where the resistor $R_1$ is short-circuited or branched by the transistor $Q_1$, thus reducing the torque of the pointer A and preventing the noise from being generated.

Figure 13:
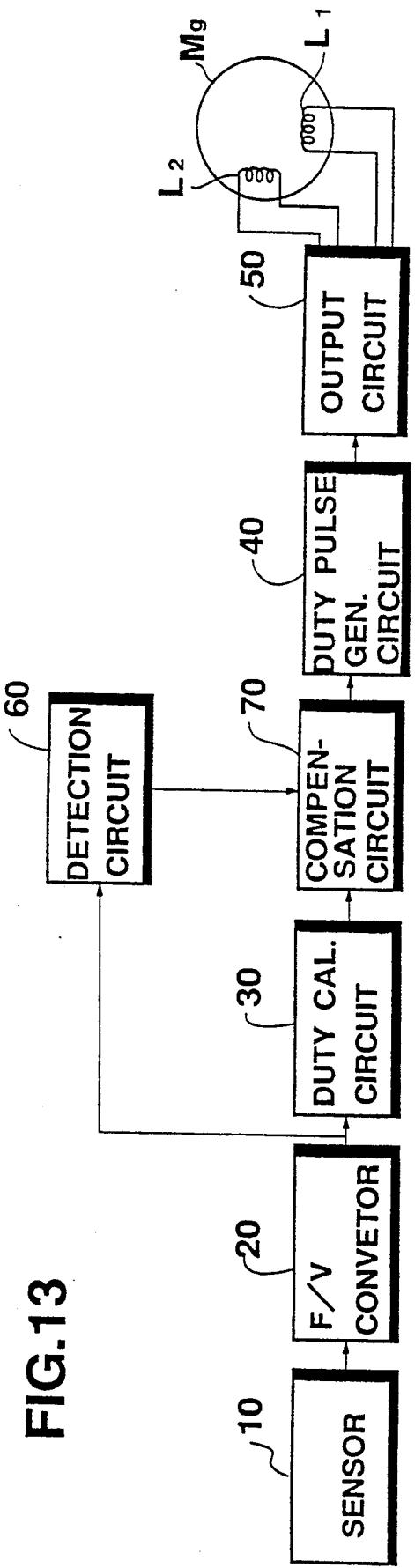
FIG. 13 shows still another embodiment of a drive unit for a cross coil type indicator according to the present invention.

FIG. 13 shows another embodiment of the cross coil type indicator according to the present invention. In this embodiment, when the rotational angle of the pointer A falls within the predetermined range of the angle $\theta$, the duty ratios of the pulse currents to be applied to the coils $L_1$ and $L_2$ are reduced.

In FIG. 13, the cross coil type indicator comprises a detection circuit 60 and a current control circuit 70. The remaining construction elements such as sensor 10, F/V converter 20, duty calculation circuit 30, duty pulse generating circuit 40, output circuit 50 are the same as those shown in FIG. 8 and the same reference numerals are used thereto.

The input of the detection circuit 60 is connected to the output of the F/V converter 20, while the output of the detection circuit 60 is connected to the input of the current control circuit 70, so as to compensate for the duty ratios of pulse currents to be applied to the coils $L_1$ and $L_2$ in accordance with the output signal from the detection circuit 60.

Figure 1:
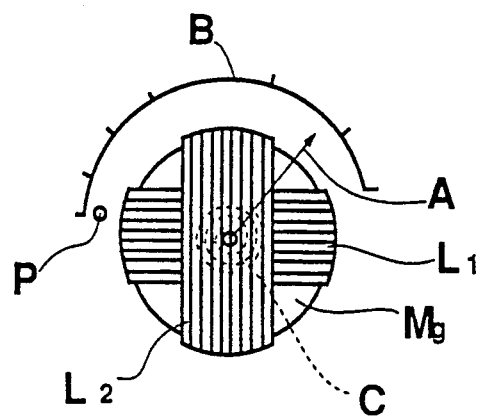
FIG. 1 shows a basic construction of the cross coil type indicator having cross coils, a magnet rotor with a pointer, a bias spring and a scale plate, according to a prior art.
Figure 2:
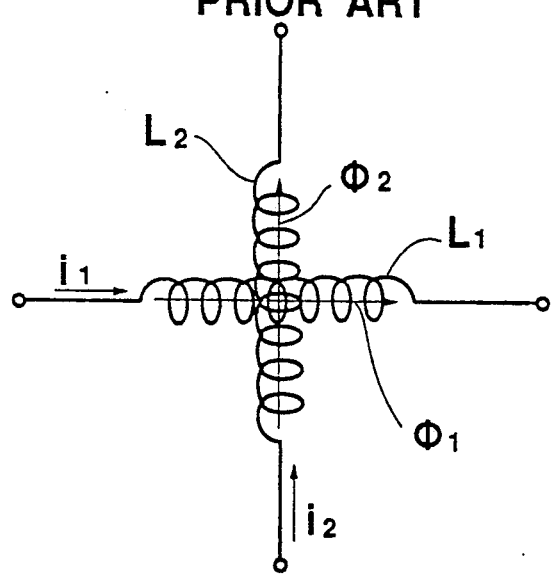
FIG. 2 shows the cross coils through which drive currents flow.
Figure 3:
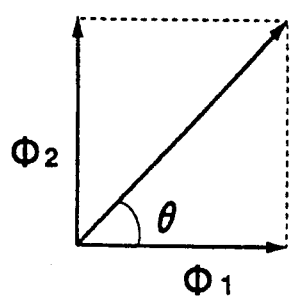
FIG. 3 shows a resultant magnetic field of the magnetic fields generated by the cross coils.

In operation, the detection circuit 60 detects the output signal from the F/V converter 20, i.e., D.C. voltage responsive to a measured variable and determines if the rotational angle of the pointer A is within the predetermined range of angle $\theta$, where the pointer A has a possibility of contacting with the stopper pin p (see FIG. 1).

When the rotational angle is above the predetermined range of angle $\theta_1$, no output signal from the detection circuit 60 is produced and no compensation operation is performed to the duty ratios of the pulse currents to be applied to the coils $L_1$ and $L_2$ through the compensation circuit 70. Namely, the duty ratios calculated by the duty calculation circuit 30 is directly applied to the duty pulse generating circuit 40 without compensation and the pulse currents having the duty ratios without compensation generated by the circuit 40 are applied to the coils $L_1$ and $L_2$ through the output circuit 50.

On the other hand, when the rotational angle of the pointer A is within the predetermined range of angle $\theta_1$, an output signal is produced from the detection circuit 60 and it is applied to the current control circuit 70. The duly ratios calculated by the duty calculation circuit 30 are multiplied by a predetermined coefficient $\beta (0 < \beta < 1)$ and modified duty ratios thus multiplied are applied to the duty pulse generating circuit 40. As a result, the pulse currents having the modified duty ratios are generated from the circuit 40 and applied to the coils $L_1$ and $L_2$ through the output circuit 50. This means that the torque of the pointer A is decreased and the generation of the noise sound is prevented since the force which tends to contact the pointer A with the stopper pin p is weakened by the reduced torque.

In this case, since the same coefficient $\beta$ is multiplied to the duty ratios of the pulse currents to be applied to the coils $L_1$ and $L_2$, the direction of the resultant magnetic field of the coils $L_1$ and $L_2$ becomes the same direction of the ones without compensation and no indication error occurs between the two cases.

Figure 15:
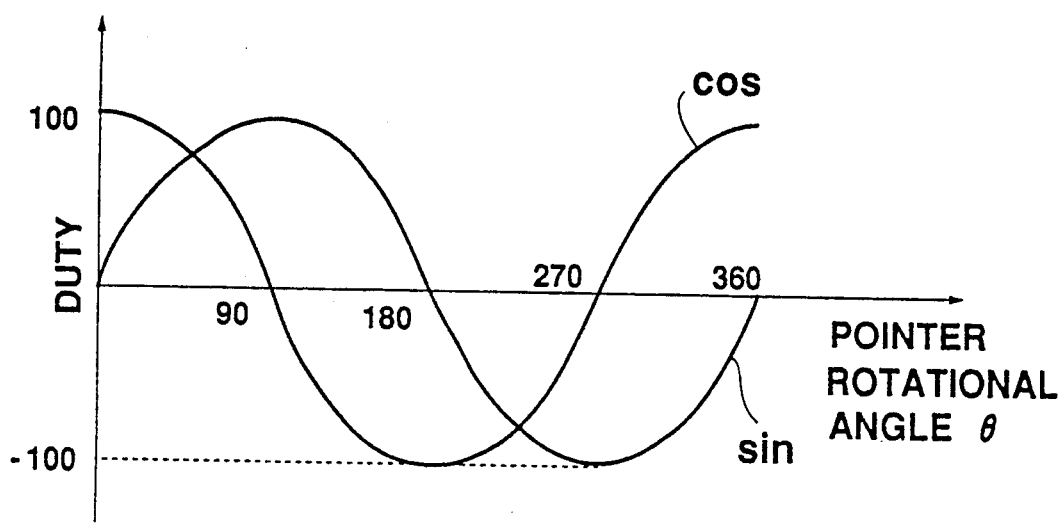
FIG. 15 shows the duty ratios of the currents without compensation.
Figure 16:
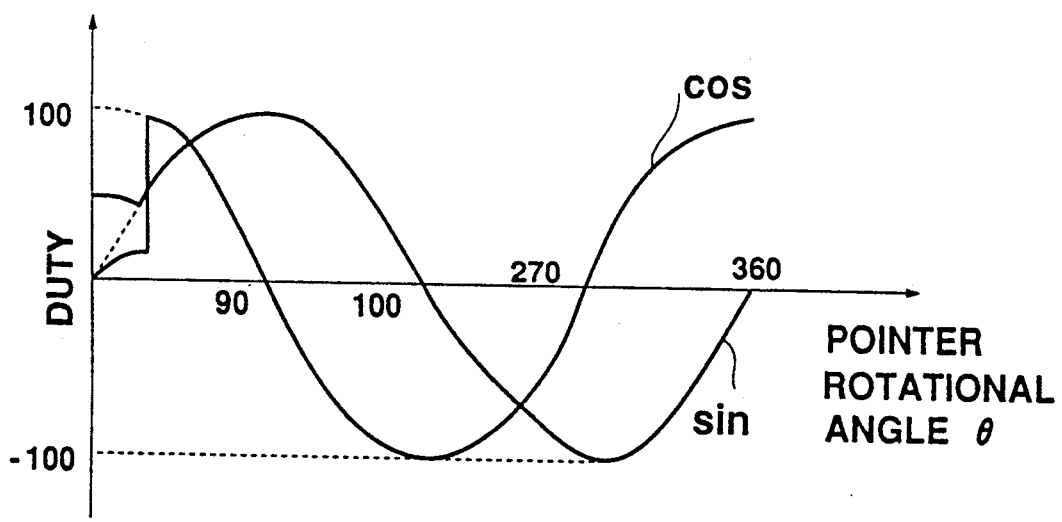
FIG. 16 shows the compensated duty ratios of the currents to be applied to the cross coils.

FIG. 15 shows the relationship between the rotational angle $\theta$ of the pointer A and the duty ratios of the pulse currents to be applied to the coils $L_1$ and $L_2$ without compensation, while FIG. 16 shows the compensated or modified duty ratios of the pulse currents.

Figure 14:
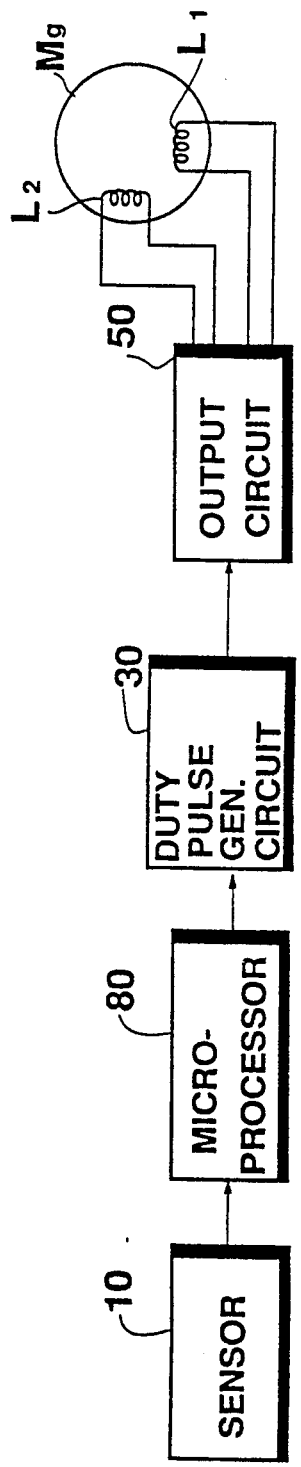
FIG. 14 shows a further embodiment of a drive unit for a cross coil type indicator according to the present invention.

FIG. 14 shows still another embodiment of the cross coil type indicator according to the present invention. In this embodiment, a microprocessor 80 having a CPU, a RAM, and a ROM is used instead of the F/V converter 20, the detection circuit 60, and the current control circuit 70 in FIG. 13. In FIG. 14, the same reference numerals shown in FIG. 13 are used to the same constructing elements.

Figure 17:
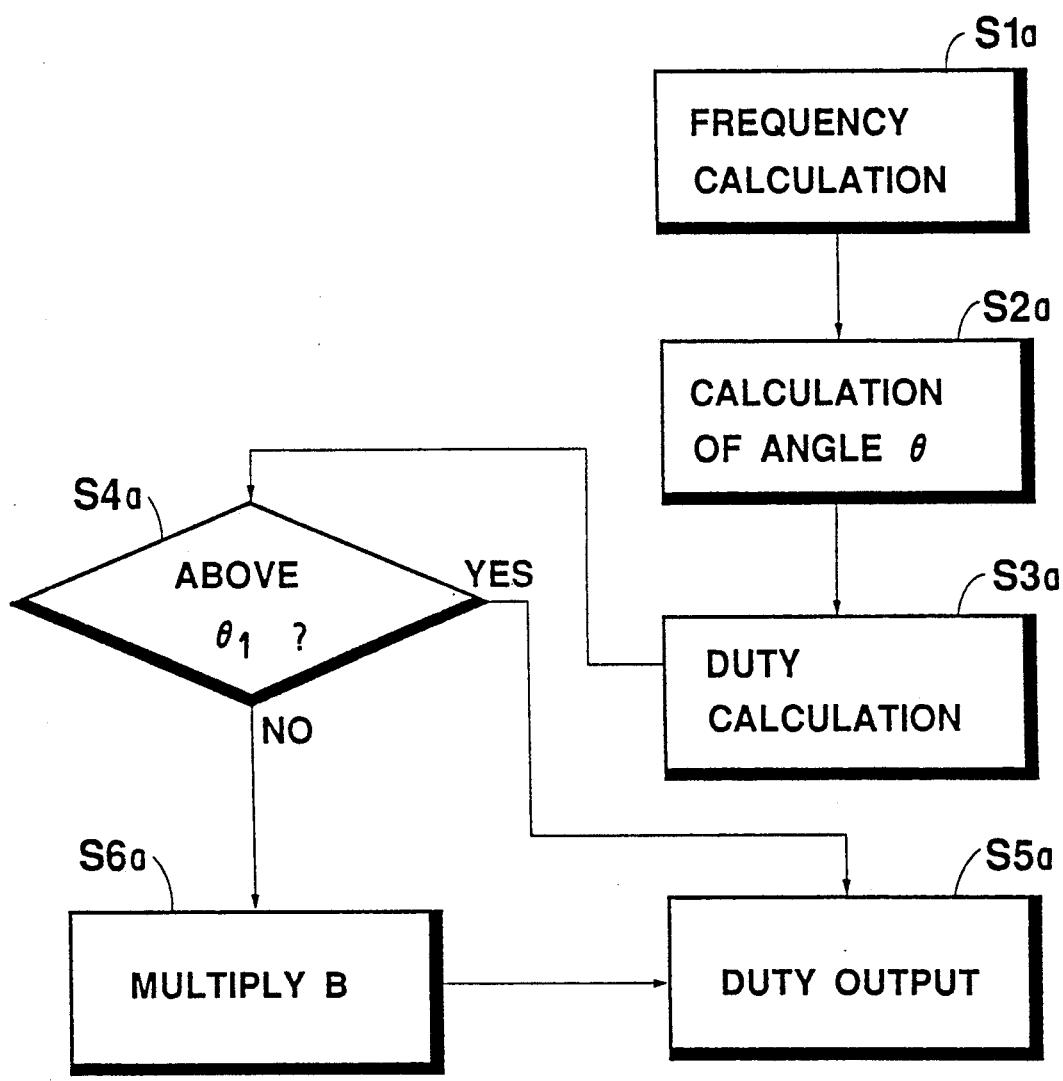
FIG. 17 is another control flow chart of the microprocessor shown in FIG. 14.

The operation of the indicator shown in FIG. 14 will now be made with reference to a control flow chart shown in FIG. 17.

In step $S_1a$, frequency of a pulse signal from the sensor 10 is calculated and the operation moves to step $S_2a$, where a rotational angle $\theta$ is calculated in accordance with the frequency thus calculated.

Then, the duty ratios are calculated in accordance with sin $\theta$ and cos $\theta$ of the rotational angle $\theta$ in step $S_3a$ and the operation goes to step $S_4a$, where a decision is made about whether or not the duty ratios thus calculated are above a predetermined angle $\theta$. If the result of the decision is YES, that is, the rotational angle $\theta$ is above the predetermined angle $\theta_1$, the operation now goes to step $S_5a$, where duty pulses having duty ratios without compensation are generated by the duty pulse generating circuit 30 and they are applied to the coils $L_1$ and $L_2$ through the output circuit 50.

On the other hand, when the result of the decision in step $S_4a$ is NO, that is, the rotational angle $\theta$ of the pointer A is within the predetermined range of angle $\theta_1$, the operation moves to step $S_6a$, where the duty ratios thus calculated are multiplied by the coefficient $\beta$, and in step $S_5a$, pulse currents having the modified or compensated duty ratios are generated from the duty pulse generating circuit 30 and they are applied to the coils $L_1$ and $L_2$ through the output circuit 50.

It is to be noted in this case, however, that the biasing force of the spiral spring C of the pointer A (see FIG. 1) has to be taken into consideration when calculating the duty ratios.

As has been described about the embodiments, in the cross coil type indicator according to the present invention, a decision is made if the rotational angle of the pointer is within a predetermined range of angle $\theta_1$, and when the rotational angle of the pointer above the predetermined angle $\theta_1$, pulse currents having duty ratios without compensation are generated and are applied to the coils $L_1$ and $L_2$. On the other hand, when the rotational angle of the pointer is within the predetermined range of angle $\theta_1$, pulse currents having compensated or modified duty ratios are generated and they are applied to the cross coils $L_1$ and $L_2$, thus reducing the torque of the pointer. As a result, the generation of the noise caused by the abutments between the pointer A and the stopper pin P can be prevented.

In the embodiments according to the present invention shown in FIGS. 8, 9, 13 and 14, the calculations of the duty ratios are shown as having been performed in either the duty calculation circuit 30 or the microprocessor 80. It is to be apparent for those skilled in the art that digital data corresponding to angles $\theta$, and at least sin $\theta$ may be stored in a ROM provided in the duty calculation circuit 30 or the ROM of the microprocessor 80 and each digital data corresponding to the rotational angle of the pointer A and its sin $\theta$ can be read out of the ROM. The data corresponding to the cos $\theta$ can also be obtained from the sin $\theta$ data by accessing to each memory location $(\theta+90°)$ of the ROM without storing data about cos $\theta$, similar to the case shown in FIG. 7.

However, please note that the drive circuit for driving cross coils shown in FIG. 7 can be applied to the other cross coil type indicators besides the indicators shown in FIGS. 8, 9, 13 and 14.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. A cross coil type indicator having a pair of cross coils arranged in quadrature, a magnet rotor having a pointer at its center and rotatively provided within the coils by resultant magnetic field generated by the cross coils and capable of indicating a detected variable by flowing pulse current in the coils in accordance with the detected variable and a stopper pin for restricting the movement of the pointer at a low rotational angle, wherein the indicator further comprises:

detection means for detecting whether or not the rotational angle of the pointer falls within a predetermined range of angle $\theta_1$ where the pointer has a possibility of contacting with the stopper pin and for providing an output signal in accordance with the result of the detection; and current control circuit means having its input connected to the output of said detection means and its output connected to output circuit means for driving the cross coils by pulse currents having duty ratios calculated by duty ratio calculation circuit means, whereby only when the actual rotational angle of the pointer is within the predetermined range of angle $\theta_1$, the amplitudes of the pulse currents from the output circuit means are reduced by an output signal from said current control circuit means.

2. An indicator including a pair of cross coils which are arranged so as to be mutually perpendicular and a magnet rotor rotatably provided within the coils, the magnetic rotor being adapted to be rotated by resultant magnetic fields generated by flowing pulse currents corresponding to a detected variable into the respective coils, thereby indicating the detected variable with an angular rotation of the magnetic rotor, said indicator further comprising:

means for storage and output of sin $\theta$ and cos $\theta$ data values corresponding to the actual rotational angle $\theta$ of the magnetic rotor responsive to the detected variable value, in which the data corresponding to cos $\theta$ is obtained from the sin $\theta$ data by accessing to each data of sin $(90°+\theta)$;

means for generating pulse currents having duty ratios responsive to the respective sin $\theta$ or cos $\theta$ data output values from the storage and output means; and output circuit means for driving the cross coils by flowing each of the pulse currents to each coil, further including a pointer mounted to the magnet rotor and a stopper pin means for restricting the movement of the pointer, in which the indicator further includes means for restraining contact noise between the pointer and the stopper pin caused by vibration of the pointer when the pointer is near the stopper pin.

3. The indicator as claimed in claim 2, wherein the restraining means comprises:

means for detecting if the rotational angle of the pointer falls within a predetermined range of angle $\theta_1$ where the pointer can contact the stopper pin; and means for reducing the amplitudes of the pulse currents supplied to the cross coils by controlling the output circuit means only when the detecting means detects that the actual rotational angle of the pointer is within the predetermined angle $\theta$, thereby reducing the rotational torque of the pointer to reduce the force with which the pointer contacts the stopper pin.

4. The indicator as claimed in claim 2, wherein the restraining means comprises:

means for detecting if the rotational angle of the pointer falls within a predetermined range of angle $\theta_1$ where the pointer can contact the stopper pin; and means for compensating the duty ratios of the pulse currents of the pulse current generating means only when the detecting means detects that actual rotational angle of the pointer is within the predetermined range of angle $\theta_1$, thereby reducing the rotational torque of the pointer to reduce the force with which the pointer contacts the stopper pin.

5. An indicator including a pair of cross coils arranged in quadrature, a magnet rotor having a pointer provided at its center and rotatable within the coils by resultant magnetic fields generated by the cross coils and capable of indicating a detected variable by flowing pulse currents in the coils in accordance with the variable, and a stopper pin for restricting the movement of the pointer at a low rotational angle, said indicator further comprising:

means for 1) detecting if the rotational angle of the pointer falls within a predetermined range of angle $\theta_1$ where the pointer can contact the stopper pin and for 2) providing an output signal in accordance with the detected result;

output circuit means for driving the cross coils by pulse currents having preliminary calculated duty ratios;

a current control circuit having an input connected to the output of said detection means and an output connected to said output circuit means; and a microprocessor having a central processing unit, random access memory, and read only memory, said microprocessor being connected between the detection means and the output circuit means, wherein digital data values corresponding to angles of sin $\theta$ and cos $\theta$ for calculating the duty ratios have been preliminarily stored in the read only memory, whereby only when the actual rotational angle of the pointer is within the predetermined range of angle $\theta$ are the amplitudes of the pulse currents from the output circuit means reduced by an output signal from said current control circuit means.

6. An indicator including a pair of cross coils arranged so as to be mutually perpendicular, a magnet rotor having a pointer at its center and rotatable within the coils by resultant magnetic fields generated by the cross coils and capable of indicating a detected variable by flowing pulse currents in the coils in accordance with the detected variable, and a stopper pin for restricting the movement of the pointer, said indicator further comprising:

means for producing sin $\theta$ and cos $\theta$ data values corresponding to the actual rotational angle $\theta$ of the pointer responsive to the detected variable;

means for generating pulse currents each having a duty ratio corresponding to the respective sin $\theta$ and cos $\theta$ data values;

means for 1) detecting if the rotational angle of the pointer falls within a predetermined angular range $\theta_1$ where the pointer can contact the stopper pin and 2) for providing an output signal in accordance with the result of the detected result;

compensation means for compensating the duty ratios of the pulse currents by controlling the pulse current generating means only when the detecting means detects that the actual rotational angle of the pointer is within a predetermined range of angle $\theta_1$; and an output circuit having an input connected to the output of the pulse current generating means and an output connected to the cross coils for supplying the pulse currents to the cross coils, whereby when the actual rotational angle of the pointer is within the predetermined range of $\theta$, the pulse currents having the compensated duty ratios are produced from the output circuit, while when the rotational angle is above the angle $\theta$, the pulse currents having duty ratios without compensation are produced from the output circuit, which currents then flow into the cross coils.

* * * * *